United States Patent [19]

Riff

[11] 4,151,544
[45] Apr. 24, 1979

[54] LEAD TERMINAL FOR BUTTON DIODE

[75] Inventor: James A. Riff, Chicago, Ill.

[73] Assignee: Motorola, Inc., Schaumburg, Ill.

[21] Appl. No.: 864,988

[22] Filed: Dec. 27, 1977

[51] Int. Cl.² .................... H01L 23/48; H01L 29/40; H01L 29/44
[52] U.S. Cl. ........................................ 357/65; 357/68; 339/275 R; 339/276 A; 174/94 R
[58] Field of Search .................... 357/65, 68; 339/275, 339/276 A, 276 T; 174/94

[56] References Cited

U.S. PATENT DOCUMENTS

| | | | |
|---|---|---|---|
| 2,094,954 | 10/1937 | Mendel et al. | 339/275 |
| 3,271,724 | 9/1966 | Brieger et al. | 339/275 |
| 3,430,191 | 2/1969 | Heimbrock | 339/276 |
| 3,446,912 | 5/1969 | Diehl et al. | 174/94 |
| 3,447,236 | 6/1969 | Hatcher | 357/71 |
| 3,496,520 | 2/1970 | Reynolds | 174/94 R |
| 3,584,265 | 6/1971 | Nier | 357/65 |
| 3,837,001 | 9/1974 | Hughes et al. | 357/65 |
| 3,878,318 | 4/1975 | Ziegler et al. | 174/94 |
| 3,910,666 | 10/1975 | McIntosh | 174/94 |
| 4,071,290 | 1/1978 | Denigris et al. | 339/276 A |

*Primary Examiner*—Andrew J. James
*Attorney, Agent, or Firm*—Phillip H. Melamed; Donald J. Lisa; James W. Gillman

[57] ABSTRACT

A tin plated brass lead terminal for a button diode is disclosed. The lead terminal comprises a flat plate portion which generally defines a horizontal plane, a first upward projection centrally connected to the flat plate portion and a plurality of second projections downwardly extending from the flat plate portion. The flat plate portion comprises a major surface which is substantially rectangular in its horizontal peripheral shape and which is intended to be soldered to a cylindrical raised contact electrode of a button diode. The first upward projection has a notch therein around which a wire lead can be wrapped and the second downward projections aid in locating the major surface of said flat plate portion with respect to the raised cylindrical contact of the button diode.

16 Claims, 3 Drawing Figures

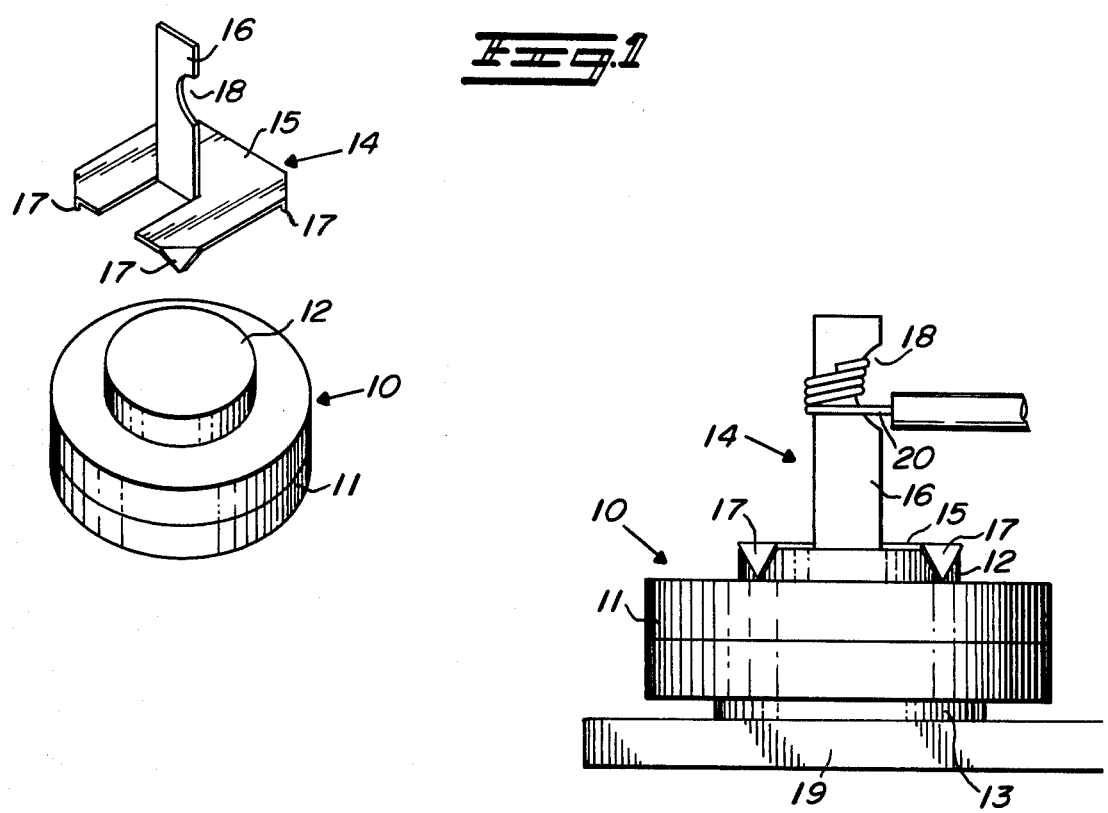
*Fig.1*
*Fig.2*
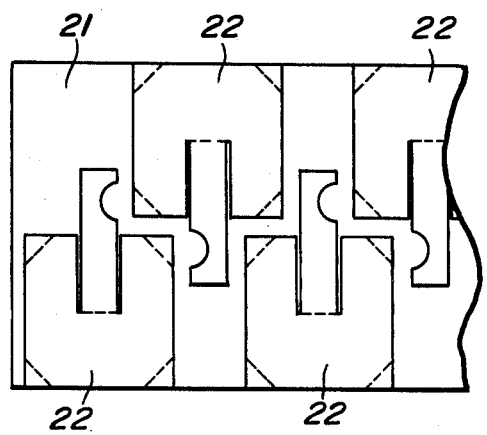
*Fig.3*

LEAD TERMINAL FOR BUTTON DIODE

BACKGROUND OF THE INVENTION

Button diodes having an integral cylindrical molded plastic body and first and second integral, raised, cylindrical metallic electrical contacts, one of these first and second contacts located on each end of the cylindrical body of the diode are readily available. These diodes are generally inexpensive and are designed so that one of their electrical contacts can be readily soldered to a heat sink plate to thereby provide efficient heat sinking of the diode.

Generally, a nail head lead is attached to the electrical contact of the button diode which is not directly soldered to a heat sink plate. The attachment of this nail head lead generally requires complex fixtures to position the nail head with respect to the raised cylindrical contact while the nail head lead is being bonded thereto. Subsequently, flexible wire leads are soldered to the end of the nail head lead furthest away from the button diode electrical contact. Nail head leads are generally separately formed from wire stock and may therefore be relatively expensive. In addition, attaching a nail head lead to the cylindrical electrical contact of a button diode requires costly fixtures for holding the nail head in place during the electrical bonding (high temperature soldering) operation.

SUMMARY OF THE INVENTION

An object of the present invention is to provide an improved lead terminal for an electrical device which overcomes the aforementioned deficiencies.

A more particular object of the present invention is to provide an improved lead terminal which may be stamped out from flat metallic stock with simple tools and which does not require special fixtures to align and attach the lead terminal to an electrical device.

A further object of the present invention is to provide an improved semiconductor assembly comprising a semiconductor device and a self-aligning lead terminal which is bonded to an electrical contact of the semiconductor device.

In one embodiment of the present invention, an improved lead terminal for an electrical device is provided. The lead terminal comprises; a metallic flat plate portion generally defining a horizontal plane, a first metallic projection connected to said flat plate portion and extending substantially away from said horizontal plane in a generally upward direction with respect to said plane, and a plurality of second projections connected to said flat plate portion and extending away from said horizontal plane in generally downward directions with respect to said plane. The first projection provides a suitable location for attaching a wire lead to said terminal, while the plurality of downward projections assist in locating and maintaining the lead terminal in a predetermined position with respect to an electrical contact of an electrical device.

The present invention also discloses an improved semiconductor assembly comprising: a semiconductor device having an integral, raised, cylindrical, metallic electrical contact; and a lead terminal bonded to said raised contact, said lead terminal comprising a metallic flat plate portion directly bonded to the semiconductor cylindrical contact, a first metallic projection connected to said flat plate portion and extending substantially away from said semiconductor device, and a plurality of at least three second projections connected to said flat plate portion and extending toward said semiconductor device, said second projections located about said semiconductor contact for locating said lead terminal with respect to said semiconductor contact.

Essentially, the present invention provides an integral lead terminal formed from flat plate stock having a first central metallic projection extending upward from a flat plate portion defining a horizontal plane. The flat plate portion has a major surface which is substantially rectangular in its outer peripheral shape. The corners of the flat plate substantially rectangular portion are bent downward with respect to the horizontal plane such that they comprise a plurality of second projections which render the lead terminal self-aligning with respect to a raised cylindrical electrical contact of a button diode. Thus the present invention provides an improved lead terminal which can be inexpensively manufactured from flat plate stock and which can be inexpensively bonded to an electrical contact without the use of costly fixtures for holding the lead terminal in place with respect to the electrical contact during the bonding operation.

BRIEF DESCRIPTION OF THE DRAWINGS

For a more complete understanding of the invention reference should be made to the drawings, in which FIG. 1 is an exploded perspective view of a semiconductor assembly comprising an improved lead terminal and a button diode;

FIG. 2 is an enlarged planar view of the semiconductor assembly shown in FIG. 1 after the assembly has been attached to a heat sink plate and a flexible wire lead has been attached to the lead terminal; and FIG. 3 is a planar view of a metallic strip of flat stock material illustrating how a plurality of the lead terminals illustrated in FIGS. 1 and 2 can be formd from flat stock material.

DESCRIPTION OF THE PREFERRED EMBODIMENT

FIGS. 1 and 2 illustrate a button diode semiconductor device 10 having an integral cylindrical molded plastic body 11, a first integral, raised, cylindrical metallic electical contact 12 located on one end of the cylindrical body 11, and a second integral, raised, cylindrical metallic electrical contact 13 located on the other end of the cylindrical body 11. FIG. 2 illustrates that the diameters of the contacts 12 and 13 are different, and while this limitation may aid in identifying the polarity of the diode 10, such a limitation is not essential to the operation of the present invention. In FIGS. 1, 2 and 3 identical reference numbers have been used to identify corresponding components.

A lead terminal generally designated by the reference number 14 is illustrated as being an integral structure comprising a flat plate portion 15 having major surfaces which generally form a horizontal plane. The major surfaces of the flat plate portion 15 are generally rectangular in their peripheral horizontal shape and a first projection 16 of the lead terminal 14 is centrally located with respect to the flat plate portion 15 and extends substantially away from the horizontal plane formed by the plate portion 15 in a generally upward direction with respect to the horizontal plane. A plurality of second projections 17, which comprises the bent corners of the flat plate portion 15, are generally located about the first projection 16 and extend from the horizonatl plane formed by the flat plate portion 15 in generally downward directions with respect to the plane. A notch 18 is provided in the projection 16 and is located a substantial distance away from the flat plate portion 15.

Essentially, the downward corner projections 17 of the lead terminal 14 aid in locating the lead terminal with respect to the electrical contact 12 such that the lead terminal becomes self-aligning and no fixtures will be needed to properly align the lead terminal with respect to the semiconductor device 12 prior to and during the bonding of the lead terminal to the electrical contact 12. Preferably, lead terminal 14 comprises a strip of flat metallic plate stock, preferably brass which has been tin plated, which has been subsequently stamped and formed such that it now has the shape of the integral lead terminal shown in FIGS. 1 and 2. The notch 18 in the first projection 16 provides a suitable location for attaching a flexible wire lead to the lead terminal 14 such that the wire lead will be located at a predetermined position with respect to the semiconductor device 10. In many applications where lead impedance is critical, the notch 18 will minimize the variation in lead inductance between different assemblies manufactured according to the teachings of the present invention.

FIG. 2 illustrates the finished semiconductor assembly shown in FIG. 1 after the button diode electrode 13 has been soldered to a metallic heat sink plate 19 and after a flexible wire lead 20 has been wrapped around the portion of the projection 16 corresponding to the notch 18 and the wire lead 20 has been soldered thereto. FIG. 2 illustrates that a major surface of the flat plate portion 15, the underside surface of the flat plate portion 15 as shown in FIGS. 1 and 2, has been soldered directly to the raised cylindrical electrical contact 12 of the button diode 10. Preferably, solder paste would be placed on top of the electrical contact 12, then the underside surface of the flat plate portion 15 would be positioned flushed against the top end surface of the cylindrical contact 12 and then the entire assembly would be heated to solder the lead terminal 14 to the semiconductor device 10. During this soldering process, the plurality of downward projecting end corners 17 are located about the cylindrical contact 12 and therefore locate the lead terminal 14 with respect to the device 10 in a predetermined location. Thus the plurality of downward projections 17 eliminate the need for separate fixtures in order to hold the lead terminal 14 in a predetermined position with respect to the button diode 10 during the soldering operation.

FIG. 2 illustrates that while the locating projections 17 extend toward the semiconductor device 10 from the flat plate portion 15, the first metallic projection 16 extends substantially away from the semiconductor device 10. Since notch 18 is located substantially away from the flat plate portion 15, and therefore also substantially away from the button diode 10, the wire wrap location defined by the notch 18 will be a substantial distance away from the semiconductor device 10. This is beneficial since the wire wrap solder connection will probably be subsequently made by hand soldering techniques, and in order to insure the reliability of the semiconductor device 10 all hand soldering should be performed substantially away from the body of the semiconductor device 10. The present invention not only provides for this but also provides a predetermined location, the notch 18, where the flexible wire is to be attached to the lead terminal projection 16. This insures that a substantially identical lead inductance will be provided between the lead 20 and the semiconductor device 10 for all assemblies constructed as shown in FIG. 2. The notch also prevents any sliding of the wire 20 on the projection 16 during the soldering operation. Preferably, the soldering of the lead terminal 14 to the button diode 10, as well as the soldering of the button diode 10 to the heat sink plate 19, is to be accomplished by a relatively high temperature solder operation, whereas the soldering of the lead 20 to the projection 16 could be accomplished by using a relatively low temperature solder operation so as to not disturb the previously made solder bond between the semiconductor device 10, the heat sink plate 19 and the lead terminal 14.

FIG. 3 illustrates how a strip of flat plate metallic material 21 can be stamped and later formed to produce the lead terminal 14 shown in FIGS. 1 and 2. Essentially, the solid lines illustrated in FIG. 3 represent the peripheral dimensions of flat stock blanks 22 which are to be punched from the flat plate stock material 21. After the blanks 22 are punched, then forming operations are performed such that bends in the blanks are created along all of the dashed lines shown in FIG. 3. In this manner a simple punch press die can be utilized to form the lead terminal 14 out of a strip of flat plate material.

While I have shown and described specific embodiments of this invention, further modifications and improvements will occur to those skilled in the art. All such modifications which retain the basic underlying principles disclosed and claimed herein are within the scope of this invention.

I claim:

1. An improved lead terminal for an electrical device, comprising:
    a metallic flat plate portion generally defining a horizontal plane;
    a first metallic projection connected to said flat plate portion and extending substantially away from said horizontal plane in a generally upward direction with respect to said plane; and
    a plurality of second projections connected to said flat plate portion and extending away from said horizontal plane in generally downward directions with respect to said plane, whereby said first projection provides a suitable location for attaching a wire lead to said terminal while said plurality of downward projections aid in locating said lead terminal in a predetermined position with respect to an electrical device.

2. An improved lead terminal according to claim 1 wherein said first projection is connected to said flat plate portion at a central location with respect to said horizontal plane formed by said flat plate portion while said plurality of second projections are located about the central location of said first projection.

3. An improved lead terminal according to claim 2 wherein said flat plate portion, said first metallic projection, and said plurality of second projections are part of an integral structure.

4. An improved lead terminal according to claim 3 wherein said flat plate portion is substantially rectangular in shape with respect to its peripheral dimensions in said horizontal plane.

5. An improved lead terminal according to claim 4 wherein said second projections comprise bent corners of said substantially rectangular flat plate portion.

6. An improved lead terminal according to claim 5 wherein said first projection has a notch therein at an end of said first projection located substantially away from said horizontal flat plate portion, whereby said notch provides a convenient location for attaching a wire to said improved lead terminal.

7. An improved lead terminal according to claim 6 wherein said integral structure of said terminal has a solderable outer surface.

8. An improved lead terminal according to claim 2 wherein said flat plate portion is substantially rectangular in shape with respect to its peripheral dimensions in said horizontal plane.

9. An improved lead terminal according to claim 8 wherein said second projections comprise bent corners of the substantially rectangular flat plate portion.

10. An improved semiconductor assembly comprising:
a semiconductor device having an integral, raised, cylindrical, metallic electrical contact; and
a lead terminal bonded to said raised contact, said lead terminal comprising,
a metallic flat plate portion, generally defining a horizontal plane, directly bonded to the semiconductor cylindrical contact,
a first metallic projection connected to said flat plate portion and extending substantially away from said semiconductor device, and away from said horizontal plane in a generally upward direction, and
a plurality of at least three second projections connected to said flat plate portion and extending downward from said horizontal plane and toward said semiconductor device, said second projections located about said semiconductor contact for locating said lead terminal with respect to said contact.

11. An improved semiconductor assembly according to claim 10 wherein said semiconductor device comprises a button diode having an integral cylindrical plastic body and first and second integral, raised, cylindrical metallic electrical contacts, one of said contacts located on each end of said cylindrical body.

12. An improved semiconductor assembly according to claim 10 wherein said flat plate portion, said first projection and said plurality of second projections are part of an integral structure comprising said lead terminal.

13. An improved semiconductor assembly according to claim 12 wherein said flat plate portion has a substantially rectangular in peripheral shape major surface and said second projections comprise bent corners of the substantially rectangular flat plate portion.

14. An improved semiconductor assembly according to claim 13 wherein said first projection includes a notch in an end of said first projection located substantially away from said electrical device.

15. An improved semiconductor assembly according to claim 14 wherein said major surface of said flat plate portion is positioned flush against an end surface of one of said cylindrical contacts of said semiconductor device.

16. An improved semiconductor assembly according to claim 15 which includes a wire lead wrapped around and bonded to said first projection and located in said notch of said first projection.

* * * * *